United States Patent [19]

Bell

[11] 4,446,440
[45] May 1, 1984

[54] DUAL MODE AMPLIFIER

[75] Inventor: R. Frank Bell, Meridian, Id.

[73] Assignee: Hewlett-Packard Company, Palo Alto, Calif.

[21] Appl. No.: 342,942

[22] Filed: Jan. 26, 1982

[51] Int. Cl.³ .............................................. H03F 3/38
[52] U.S. Cl. .................................. 330/10; 330/207 A; 330/297; 330/51
[58] Field of Search ........... 330/10, 84, 124 R, 207 A, 330/297, 51

[56] References Cited
U.S. PATENT DOCUMENTS
4,125,814  11/1978  Baker ................................. 330/251

Primary Examiner—James B. Mullins
Assistant Examiner—G. Wan
Attorney, Agent, or Firm—F. David LaRiviere; William H. MacAllister; Leslie G. Murray

[57]  ABSTRACT

An apparatus amplifies a signal in two different modes. The apparatus amplifies the signal in a linear mode when the voltage of the signal is much less than the voltage of the power source, and in a switching mode when the signal is at other voltages.

8 Claims, 5 Drawing Figures

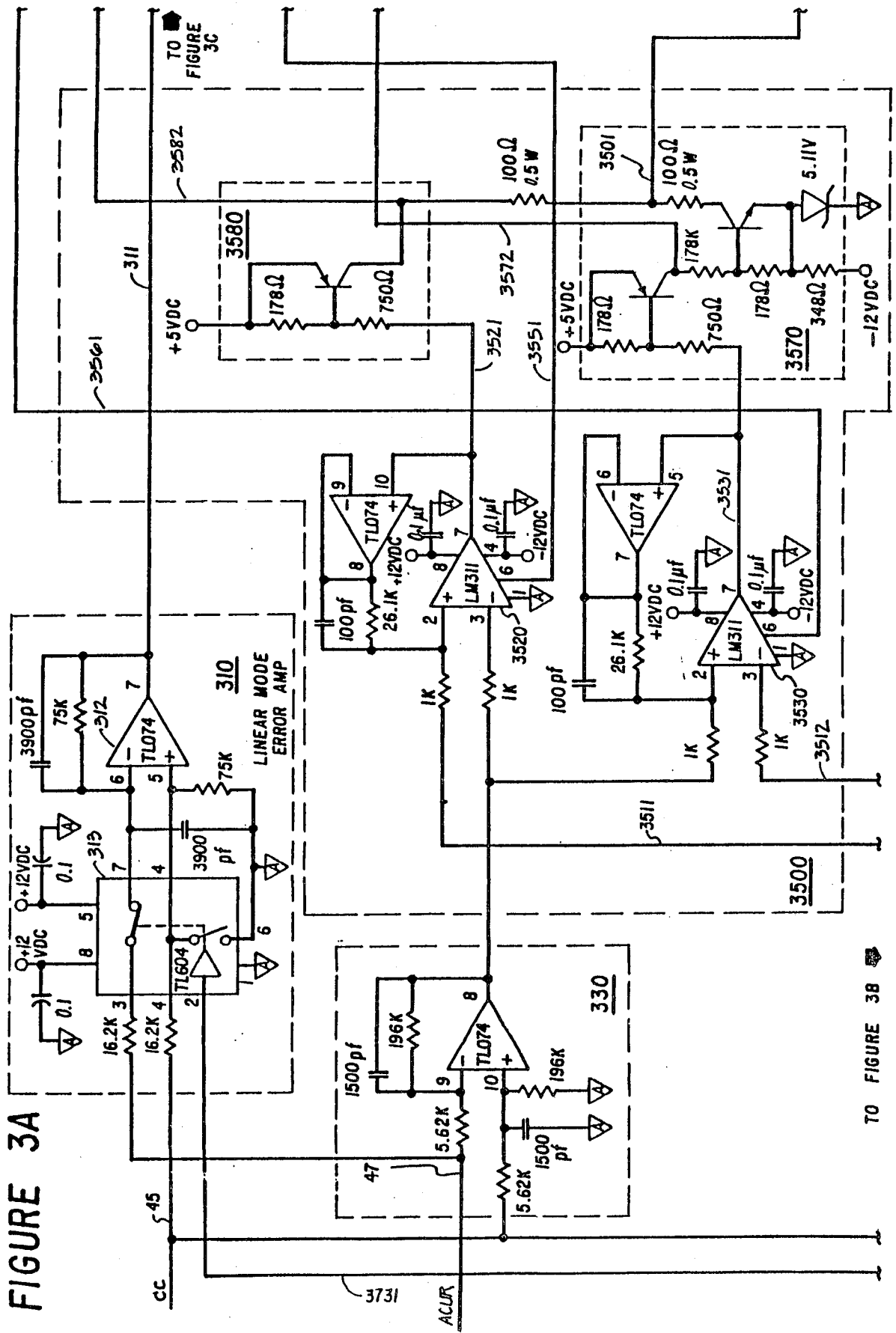

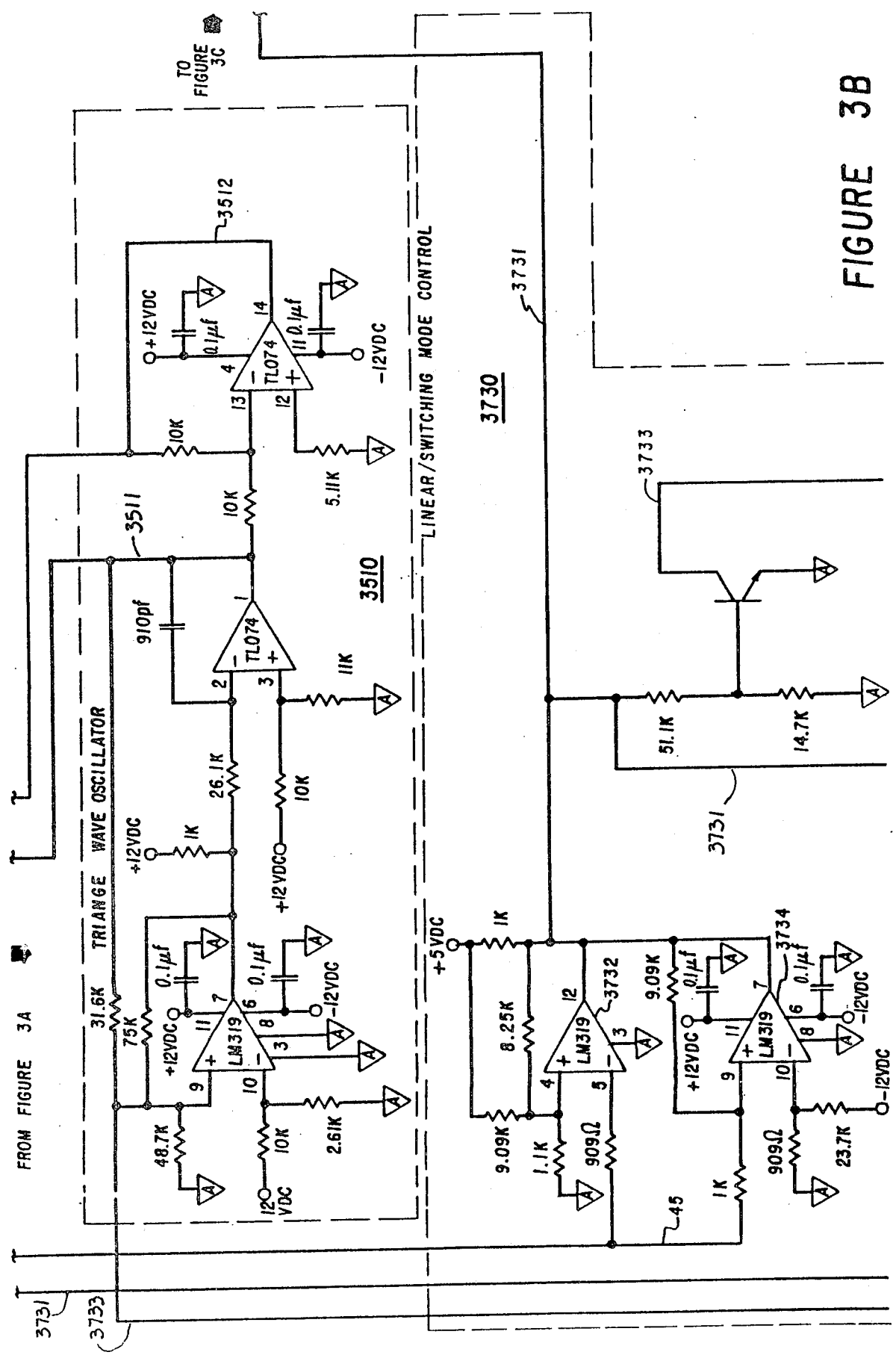

DUAL MODE AMPLIFIER

BACKGROUND OF THE INVENTION

Amplifier applications requiring operation over a wide power range have typically utilized linear power amplifiers. Linear power amplifiers perform well at both low and high power levels. However, linear amplifiers are efficient only when their output voltage is either very low or near the power supply voltage. In an application such as a disc data storage device the power efficiency of a linear power amplifier can be as low as 35% or less.

A switching mode amplifier is more power efficient. Switching mode amplifiers saturate when they are turned on, providing high current at a voltage near the power supply voltage. When the switching amplifier is turned off, no current is conducted. Current is conducted only at a voltage near the power supply voltage and hence this method of amplification is typically very power efficient. In a switching mode amplifier, the amount of current conducted can be controlled by varying the duty cycle of the amplifier. This can be accomplished by various methods such as pulse width modulation. However, when the desired output voltage is small in comparison to the power supply voltage, the finite time required to switch the amplifier on and off becomes significant. In practice, this limits the dynamic range of switching amplifiers, making them impractical for applications requiring very low as well as high power levels.

SUMMARY OF THE INVENTION

In accordance with the preferred embodiment of the present invention, a power amplifier operates in two different modes. The amplifier operates in a linear mode when the voltage of the signal is much less than the voltage of the power source, and in a switching mode when the signal is at other voltages. Amplification of the signal in two modes has the advantage of allowing the apparatus to amplify signals over a wide dynamic range with low power dissipation.

An amplifier in accordance with the preferred embodiment is particularly useful in driving a linear motor in a magnetic disc data storage device. For example, the linear motor is used to position the read/write head over a track on the disc. To do this, the linear motor requires a large amount of power to quickly move the read/write head to a different track and a small amount of power to maintain its position over that track.

PREFERRED EMBODIMENT OF THE INVENTION

Figure 1:
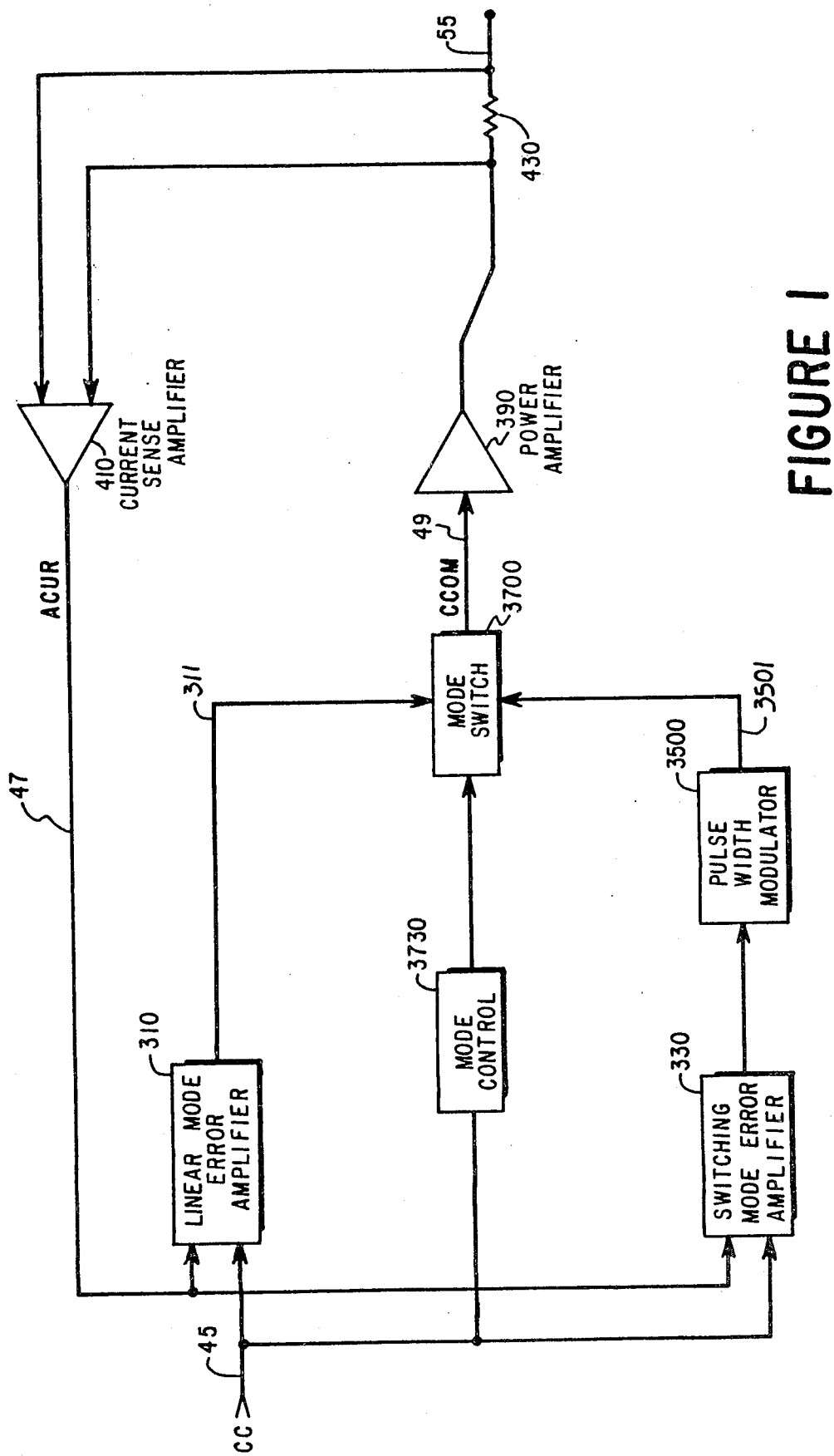
FIG. 1 is a block diagram of a dual mode amplifier in accordance with the preferred embodiment.

Referring to FIG. 1 an input signal on a line 45 is applied to a linear mode error amplifier 310 and a switching mode error amplifier 330. Switching mode error amplifier 330 is coupled to a mode switch 3700 through a pulse width modulator 3500, and the linear mode error amplifier 310 is connected directly to mode switch 3700. Mode selector 3700 causes the output of either linear mode amplifier 310 or pulse width modulator 3500 to be coupled to a power amplifier 390. The signal to be applied to power amplifier 390 is determined by a mode control circuit 3730 which continuously monitors the input signal magnitude. Power amplifier 390 is coupled through a current sensing resistor 430 to an output node 55 of the system. The input nodes of a differential amplifier 410 are connected to the terminals of current sensing resistance 430. The output node of amplifier 410 provides a feedback signal on a line 47 to both switching mode error amplifier 330 and linear mode error amplifier 310.

Figure 2:
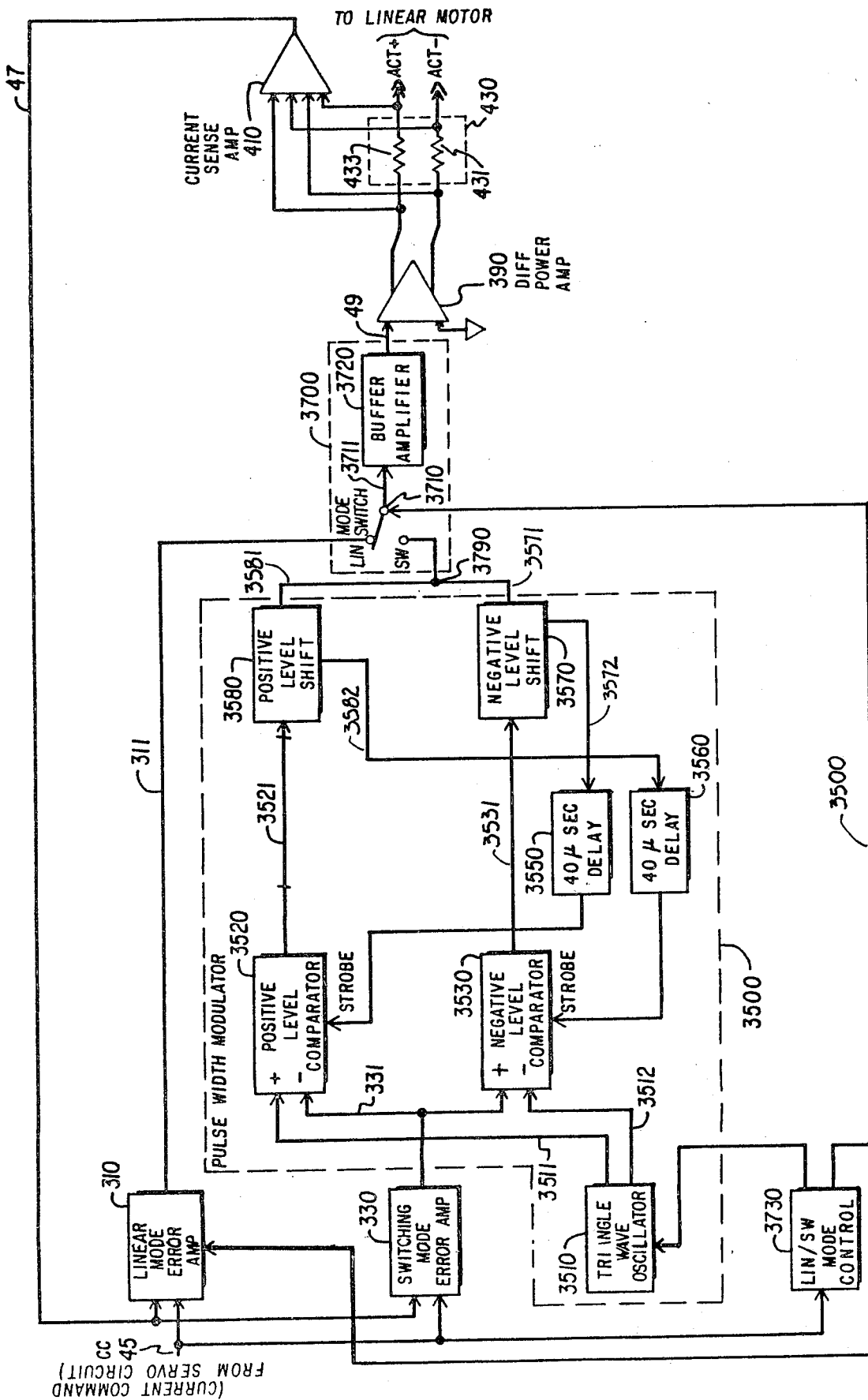
FIG. 2 is a detailed block diagram of the dual mode amplifier in accordanced with the preferred embodiment.

Referring now to FIG. 2, the pulse width modulator 3500 includes a triangle wave oscillator 3510, a positive level comparator 3520, and a negative level comparator 3530. The output signal of the switching mode error amplifier 330 is coupled via line 331 to comparators 3520 and 3530. The output signal of positive level comparator 3520 is coupled via line 3521 to positive level shift circuit 3580. The negative level shift 3570 provides a signal on line 3582 to the strobe input of negative level comparator 3530 through a 40 microsecond delay circuit 3560. The output of negative level comparator 3530 is coupled via line 3531 to the negative level shift circuit 3570. The negative level shift 3570 provides a signal on line 3572 to the strobe input of positive level comparator 3520 through a 40 microsecond delay circuit 3550. The outputs of level shift circuits 3580 and 3570 on lines 3581 and 3571 respectively are coupled together in a wired "or" circuit at node 3790. Node 3790 is the output of the pulse width modulator 3500.

Mode selector circuit 3700 includes a mode switch 3710 which, in response to the mode control circuit 3730 output on line 3731, selects the output from either the linear mode error amplifier 310 or the pulse width modulator 3500 to be coupled via a buffer amplifier 3720 to differential power amplifier 390. When the amplitude of the input signal on line 45 is greater than 1 volt of either positive or negative polarity, mode switch 3710 selects the output signal of pulse width modulator 3500 to be connected to differential power amplifier 390. When the amplitude of the input signal on line 45 is less than 0.5 volts of either polarity, mode switch 3710 selects the output signal of linear mode error amplifier 310. When the amplitude of input signal 45 is between 0.5 volts and 1 volt, mode switch 3710 is in a region of hysteresis, i.e., whichever output, either from linear mode error amplifier 310 or pulse width modulator 3500, is selected when the amplitude of the signal on line 45 enters this region, that output remains coupled to amplifier 390 while the amplifier is in the region of hysteresis.

Buffer amplifier 3720 is an inverting amplifier which supplies the proper drive signal to power amplifier 390. Mode selector 3700 also includes a mode control 3730 coupled to input signal 45, mode switch 3710, linear mode error amplifier 310, and pulse width modulator 3500 at triangle wave oscillator 3510.

Current sensing resistor 430 includes resistors 431 and 433 coupled to different output nodes of differential power amplifier 390. Current sense amplifier 410 includes 4 input nodes, wherein each lead of resistors 431 and 433 is coupled to a different input node. The output signal of current sense amplifier 410 is coupled via line 47 to linear mode error amplifier 310 and switching mode error amplifier 330.

Figure 3C:
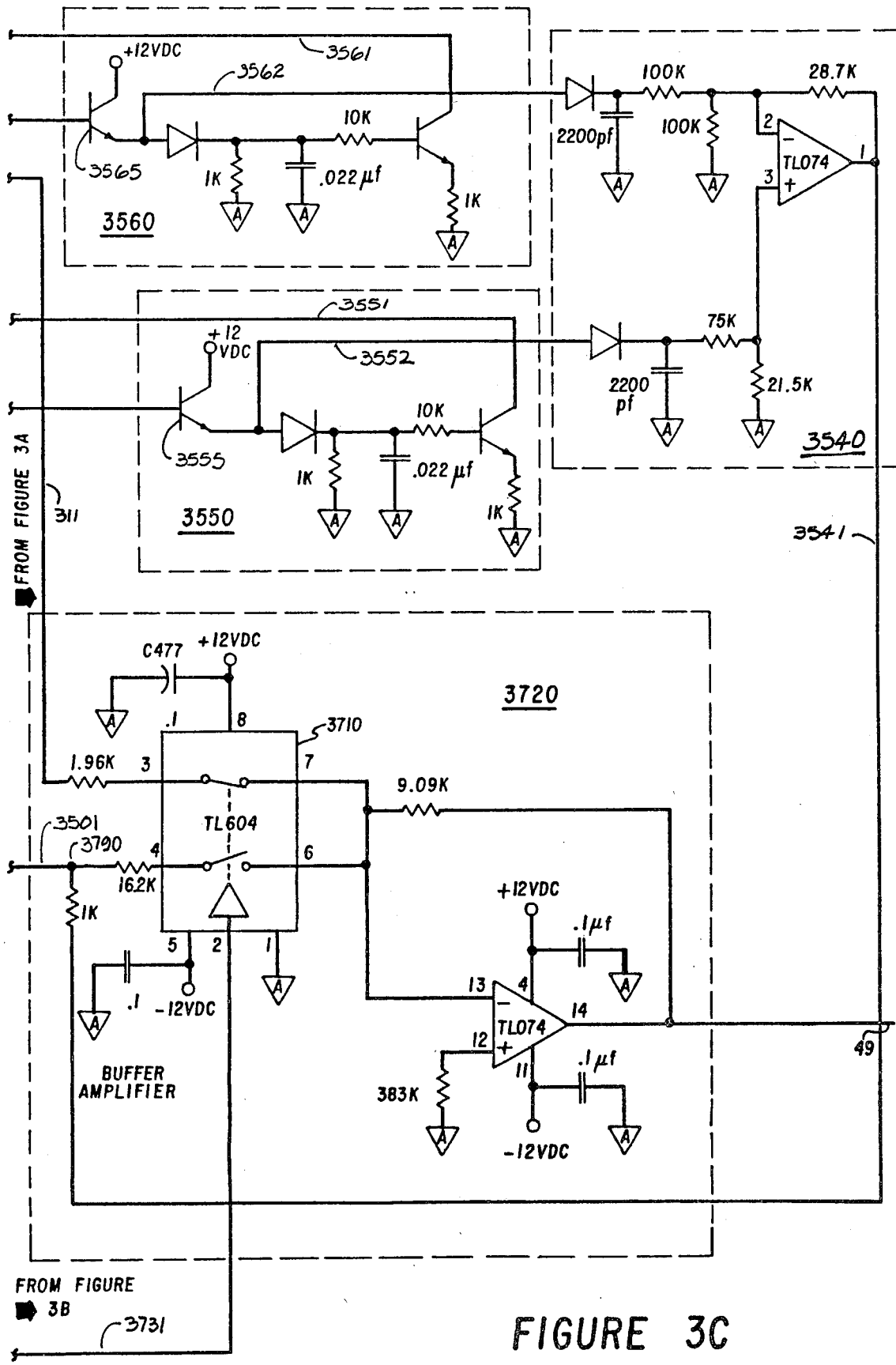
FIGS. 3a, b, c are detailed schematic diagrams of an embodiment of the present invention.

FIG. 3 is a detailed schematic of linear mode error amplifier 310, pulse width modulator 3500, mode control 3730 and buffer amplifier 3720. Some of the component values are indicated.

The mode control circuit 3730 determines whether the amplifier will operate in the linear mode or the switching mode. It consists of two analog voltage comparators 3732 and 3734 acting as a window detector circuit. If the Current Command signal (CC) on line 45 is greater than one volt of either polarity, corresponding to two amperes of linear motor current, the circuit will automatically select the switching mode. If the Current Command signal on line 45 is less than 0.5 volts of either polarity, corresponding to one ampere of linear motor current, the circuit selects the linear mode. Between 0.5 and 1.0 volts is a region of hysteresis where the circuit remains in the previous mode. That is, if the signal on line 45 is less than 0.5 volts but is increasing, the circuit will remain in the linear mode until the signal on line 45 reaches 1.0 volts. Conversely, if the signal on line 45 is greater than 1.0 volts and is decreasing, the circuit will stay in the switching mode until the signal on line 45 falls below 0.5 volts. This hysteresis prevents the circuit from switching unnecessarily between modes when the signal on line 45 remains near the threshold. It also prevents signal noise from causing a change between modes.

Mode control circuit 3730 has two outputs. The first output on line 3731 controls the electronic switch 3710 which selects either the linear mode error signal on line 311 or the pulse width modulated signal on line 3501 to be applied to the power amplifier input (not shown) via line 49. The output on line 3731 is also used to discharge two critical capacitors in the linear mode error amplifier 310 when the switching mode is selected. The mode control output signal on line 3733 is used to disable triangle wave oscillator 3510 in pulse width modulator 3500 when the linear mode is selected. This is done to reduce crosstalk from the oscillator to linear mode error amplifier 310.

The linear mode error amplifier 310 is used only in the linear mode and includes a differential amplifier 312 and an electronic switch 313. The output of this circuit is a signal on line 311 which is proportional to the difference between the Current Command (CC) signal on line 45 and the Actuator Current (ACUR) signals on line 47. The differential voltage gain is 4.63 (13.3 dB), and the bandwidth is limited to 544 Hz by feedback capacitors. The electronic switch 313 ensures that the feedback capacitors are discharged when the switching mode is selected. This eliminates large transients when going from the switching mode to the linear mode. The 544 Hz pole in this circuit is the lowest frequency pole in the linear mode actuator driver feedback loop and therefore controls the linear mode performance.

In the switching mode the Current Command signal processing generates a pulse width modulated pulse train with an average value proportional to the difference between the Current Command (CC) signal on line 45 and the Actuator Current (ACUR) signal on line 47. The amplitude of the pulse train is carefully controlled so that power amplifier 390 output stage will switch quickly from cutoff to saturation, and from saturation to cutoff, but none of the other stages will saturate. This eliminates the excessive recovery time which would result if the low level stages were driven to saturation.

An additional feature is included in pulse width modulator 3500 to solve a problem in the power amplifier output stage not shown. The output stage is a bridge, or "H", configuration which consists of four transistors arranged in two "totem poles" between the + and −36 volt power supplies not shown. Obviously, both transistors in a "totem pole" must not turn on at the same time, or a short circuit between power supplies will result. To prevent a transient of this nature when the signal polarity reverses (one transistor in the "totem pole" turning on before the other has completely turned off), a 40 microsecond delay is inserted in the waveform at the point of polarity reversal.

One other circuit function should be noted. The switching waveforms return not to zero but to some small voltage, approximately 0.5 volts, of the opposite polarity. This small amount of reverse drive assures and speeds up the turn off of the output stage not shown, but is not enough to turn the output stage on in the opposite direction.

Switching mode error amplifier 330 outputs a signal proportional to the difference between the Current Command (CC) signal on line 45 and the Actuator Current (ACUR) signal on line 47. The differential voltage gain is 34.9 (30.8 dB), and the bandwidth is limited to 544 Hz by feedback capacitors. There is no problem with stored charge on the feedback capacitors as in the linear mode, so no switching to dump the charge is provided. The 544 Hz pole in this circuit is the lowest frequency pole in the switching mode actuator driver feedback loop and therefore controls the switching mode performance.

Comparator 3520 operates on positive error signals, and comparator 3530 operates on negative error signals. The second input of the positive comparator 3520 is a positive triangle wave on line 3511 with a negative peak at 0 volts and a positive peak at +5 volts. Conversely, the second input of the negative comparator 3530 is a negative triangle wave on line 3512 with a negative peak at −5 volts and a positive peak at 0 volts. Both triangle waves are derived from the same oscillator 3510, and the oscillator is gated off when mode control circuit 3730 is in the linear mode. The oscillator frequency is substantially constant at approximately 24 KHz.

Comparators 3520 and 3530 used in the pulse width modulator have a strobe input on lines 3551 and 3561 respectively which is used to force the comparators to be inactive regardless of the other inputs. The strobe input to comparator 3530 is derived from the output of positive shift circuit 3580 on line 3582 via a 40 microsecond delay circuit 3560. Similarly, the strobe input to comparator 3520 is derived from the output of positive shift circuit 3570 on line 3572 via a 40 microsecond delay circuit 3550. When one comparator output is active, the other comparator is immediately strobed off. The strobe is maintained until approximately 40 microseconds after the first comparator becomes inactive.

A pair of transistors 3555 and 3565 connected as emitter followers buffer the signals on lines 3572 and 3582 rspectively. The emitter follower outputs are used to drive the 40 microsecond delay circuits 3550 and 3560 and the level shift offset circuit 3540 via lines 3552 and 3562. The offset circuit 3540 provides a small voltage of opposite polarity on line 3541 to be added to the pulse width modulator 3500 output signal on line 3501 at node 3790. This ensures that the power output stage (block 390 on FIG. 1) will turn off, but is not enough of a signal to turn the output stage on in the opposite direction.

The buffer amplifier 3720 selects and amplifies either the linear mode error signal on line 311 or the pulse width modulator output on line 350. The amplifier gain is determined by the operating mode. Buffer amplifier 3720 is an inverting operational amplifier. Mode switching is done by an analog electronic switch 3710 at the summing junction 3790. The voltage gain of buffer amplifier 3720 is 4.64 (13.3 dB) in the linear mode, and 0.561 (−5.0 dB) in the switching mode. The bandwidth of the circuit is limited only by the characteristics of the operational amplifier selected and does not affect the feedback loop performance. The buffer amplifier output is the signal on line 49.

I claim:

1. In an electrical circuit for amplifying an electrical signal received at an input node the combination comprising:
   a first amplifier means coupled to said input node for amplifying said electrical signal and providing a first output signal;
   a second amplifier means coupled to said input node for amplifying said electrical signal and providing a second output signal;
   a mode selector means coupled to the first amplifier means and to the second amplifier means and to said input node responsive to said electrical signal to provide a power input signal selected from said first and second output signals;
   a power amplifier means which operates in two modes coupled to the mode selector means and responsive to said power input signal, said power amplifier operating in a linear mode when the power input signal is said first output signal and in a switching mode when the power input signal is said second output signal.

2. The combination as in claim 1 wherein the mode selector means includes:
   a mode control means coupled to said input node responsive to said electrical signal to provide a mode selection signal; and
   an electronic switching means coupled to the first amplifier means and to the second amplifier means and to the mode control means responsive to said mode selection signal to provide a power input signal selected from said first and second output signals.

3. The combination as in claim 2 further including feedback means coupled to the power amplifier means and to the first and second amplifier means to provide a feedback signal from said power amplifier means to said first and second amplifier means.

4. The combination as in claim 3 wherein the first amplifier means includes:
   comparator means coupled to said input node and to said feedback means to compare said electrical signal to said feedback signal and provide a first error signal representing the difference between said feedback signal and said electrical signal; and
   amplifier means coupled to said comparator means and to said mode control means for amplifying said first error signal and providing a first output signal proportional to the difference between said electrical signal and said feedback signal, said amplifier means responsive to said mode selection signal, said mode selection signal disabling said amplifier means when said electronic switch means responsive to said mode selection signal selects said second output signal.

5. The combination as in claim 4 wherein the second amplifier means includes:
   comparator means coupled to said input mode and to said feedback means to compare said electrical signal to said feedback signal and provide a second error signal representing the difference between said feedback signal and said electrical signal;
   amplifier means coupled to said comparator means for amplifying said second error signal and providing a second output signal proportional to the difference between said electrical signal and said feedback signal; and
   modulation means coupled to said comparator means and to said electronic switching means to provide modulation of said second output signal.

6. The combination as in claim 5 wherein the mode control means includes:
   first comparator means coupled to said input node and to said electronic switching means for comparing said electrical signal to a first reference voltage and providing a first mode selection signal, said electronic switching means responsive to said first mode selection signal to select said first output signal; and
   second comparator means coupled to said input node and to said electronic switching means for comparing said electrical signal to a second reference voltage and providing a second mode selection signal, said electronic switching means responsive to said second mode selection signal to select said second output signal.

7. The combination as in claim 6 wherein the second amplifier means further includes an oscillator means coupled to said modulation means and to said mode control means to provide a modulation signal at a substantially constant frequency, said oscillator means responsive to said mode control signal, said mode control signal disabling said oscillator means when said electronic switching means responsive to said mode control signal selects said first output signal.

8. The combination as in claim 7 wherein said modulation means provides pulse width modulation of said second output signal.

* * * * *